United States Patent
Wang

(10) Patent No.: US 9,349,331 B2
(45) Date of Patent: May 24, 2016

(54) SHIFT REGISTER UNIT CIRCUIT, SHIFT REGISTER, ARRAY SUBSTRATE AND DISPLAY APPARATUS

(71) Applicant: Beijing BOE Optoelectronics Technology Co., Ltd., Beijing (CN)

(72) Inventor: Shijun Wang, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 276 days.

(21) Appl. No.: 13/971,524

(22) Filed: Aug. 20, 2013

(65) Prior Publication Data

US 2014/0098015 A1    Apr. 10, 2014

(30) Foreign Application Priority Data

Sep. 13, 2012  (CN) .................. 2012 2 0467195 U

(51) Int. Cl.
   G09G 3/36     (2006.01)
   G11C 19/28    (2006.01)

(52) U.S. Cl.
   CPC ............ *G09G 3/3611* (2013.01); *G09G 3/3677* (2013.01); *G11C 19/28* (2013.01); *G09G 2310/0283* (2013.01); *G09G 2310/0286* (2013.01)

(58) Field of Classification Search
   None
   See application file for complete search history.

(56) References Cited

U.S. PATENT DOCUMENTS

| | | | |
|---|---|---|---|
| 2004/0189584 A1* | 9/2004 | Moon | 345/100 |
| 2007/0248204 A1 | 10/2007 | Tobita | |
| 2008/0079001 A1* | 4/2008 | Umezaki et al. | 257/59 |
| 2010/0201659 A1* | 8/2010 | Miyake et al. | 345/205 |
| 2011/0222645 A1 | 9/2011 | Tobita | |
| 2011/0310074 A1* | 12/2011 | Ochiai et al. | 345/208 |
| 2012/0105397 A1 | 5/2012 | Tan et al. | |
| 2013/0088265 A1 | 4/2013 | Chen | |

FOREIGN PATENT DOCUMENTS

| | | |
|---|---|---|
| CN | 102629444 A | 8/2012 |
| JP | 2008276849 A | 11/2008 |
| JP | 2008287753 A | 11/2008 |
| KR | 100745406 B1 | 8/2007 |

OTHER PUBLICATIONS

English abstract of CN102629444A, listed above, 1 page.
Extended European Search Report issued by the European Patent Office on Feb. 28, 2014 for International Application No. 13180997.2, 11 page.
European Patent Office Communication Appln. No 13180997.2-1904; Dated Jun. 9, 2015.

* cited by examiner

*Primary Examiner* — Adam R Giesy
*Assistant Examiner* — Henok Heyi
(74) *Attorney, Agent, or Firm* — Ladas & Parry LLP

(57) ABSTRACT

Embodiments of the present disclosure relate to a technique of liquid crystal display, and provide a shift register unit circuit, a shift register, an array substrate and a display apparatus. A first TFT is added in the shift register unit circuit and is used to pull down the level of a node PU when a frame start signal is at a high level and a forward clock signal changes from a low level to the high level, such that a H-line defect generated in an output signal caused by a coupling effect of a coupling circuit can be avoided, which is advantageous for increasing productivity and yield rate of products.

6 Claims, 9 Drawing Sheets

SHIFT REGISTER UNIT CIRCUIT, SHIFT REGISTER, ARRAY SUBSTRATE AND DISPLAY APPARATUS

CROSS REFERENCE TO RELATED APPLICATIONS

This application claims priority from Chinese National Application No. 201220467195.7 filed on Sep. 13, 2012, the contents of which are incorporated herein by reference.

TECHNICAL FIELD OF THE DISCLOSURE

The present disclosure relates to a technical field of liquid crystal displaying, and particularly to a shift register unit circuit, a shift register, an array substrate and a display apparatus.

BACKGROUND

At present, in design of liquid crystal panel of mobile products, a shift register circuit capable of accomplishing bi-directional scanning has been widely used as a gate driving circuit and is integrated on an array substrate to achieve scanning and driving the panel, such that the cost may be saved and a design with two symmetric sides may be achieved for the panel. In addition, bonding area and fan-shaped wiring space for a gate circuit control chip may be omitted, such that a narrow frame design may be achieved, meanwhile a bonding process in the direction of gate may be omitted, which is advantageous for increasing the productivity and yield rate.

The bi-directional scanning shift register circuit includes a shift register unit circuit in a first row, a shift register unit circuit in a last row, and at least one shift register unit circuit in a middle row. A practicable shift register unit circuit in the first row is shown in FIG. 1a and includes ten Thin Film Transistors and a capacitor, wherein a frame start signal (STV) input terminal is connected to a signal input terminal (INPUT). A shift register unit circuit in the last row is shown in FIG. 1b, which is matched with the shift register unit circuit in the first row as shown in FIG. 1a and includes ten Thin Film Transistors and a capacitor, a frame start signal input terminal is connected to a signal reset terminal (RESET). A shift register unit circuit in a middle row is shown in FIG. 1c, which is matched with the shift register unit circuit in the first row as shown in FIG. 1a and the shift register unit circuit in the last row as shown in FIG. 1b and includes ten Thin Film Transistors and a capacitor.

When a forward scanning is performed, as shown in FIG. 1d, an output signal of a shift register unit in a current row is used as an input signal of a shift register unit in a next row, and an output signal of the shift register unit in the next row is used as a reset signal of the shift register unit in the current row for resetting the shift register unit in the current row. When a reverse scanning is performed, as shown in FIG. 1e, the output signal of the shift register unit in the next row is used as an input signal of the shift register of the current row, and the output signal of the shift register unit in the current row is used as a reset signal of the shift register unit in the next row for resetting the shift register unit in the next row. A timing waveform for the forward scanning is as shown in FIG. 1f, in the forward scanning, when the frame start signal is at a high level, a forward clock signal (CLK) changes from a low level to a high level, the output terminal outputs a pulse of the forward clock signal; A timing waveform for the reverse scanning is as shown in FIG. 1g, in the reverse scanning, when the frame start signal is at a high level, a reverse clock signal (CLKB) changes from a low level to a high level, the output terminal outputs a pulse of the reverse clock signal.

However, when the forward clock signal or the reverse clock signal changes from the low level to the high level, if the frame start signal is also at the high level, it tends to pull up the level at a node PU (pull up node) in FIG. 1a, FIG. 1b and FIG. 1c. As shown in FIG. 1h, since a size of a Thin Film Transistor TFT M01 is large, there is a large parasitic capacitance C02, and before the forward clock signal becomes the high level, the node PU keeps in the low level, as shown in FIG. 1i; when the frame start signal is at the high level, the forward clock signal changes from the low level to the high level, the node PU also becomes the high level due to the parasitic capacitance of TFT M01, such that there occurs a little swell in the waveform of the node PU, also a little swell occurs in the output signal due to an coupling effect of a capacitor C01, such that a H-line defect is generated on a display screen.

SUMMARY

Embodiments of the present disclosure provide a shift register unit circuit, a shift register, an array substrate and a display apparatus for removing the H-line defect of TFTs.

A shift register unit circuit includes: a first Thin Film Transistor (TFT) having a gate connected to a frame start signal input terminal, a first electrode connected to a switching-off voltage signal (VGL) input terminal, an operating voltage (VDD) input terminal or a grounding voltage (VSS) input terminal; a second TFT having a gate connected to a second electrode of the first TFT, a second electrode connected to a forward clock signal input terminal and a first electrode connected to a signal output terminal; a third TFT having a gate connected to a signal input terminal, a second electrode connected to an operating voltage input terminal and a first electrode connected to the second electrode of the first TFT; a fourth TFT having a gate connected to a signal reset terminal, a second electrode connected to the first electrode of the third TFT and a first electrode connected to the grounding voltage input terminal; a fifth TFT having a gate connected to a reverse clock signal input terminal, a second electrode connected to a signal output terminal and a first electrode connected to the switching-off voltage signal input terminal; and a capacitor having a first electrode connected to the second electrode of the first TFT and a second electrode connected to the output terminal (OUTPUT).

Preferably, in the above shift register unit circuit, the first electrode of TFT is source and the second electrode of TFT is drain, and the first electrode of the capacitor is a positive electrode and the second electrode of the capacitor is a negative electrode.

A shift register includes at least three shift register unit circuits provided in the embodiments of the present disclosure, wherein in the shift register unit circuit in a first row, the first electrode of the first TFT is connected to the operating voltage input terminal; in the shift register unit circuit in a middle row, the first electrode of the first TFT is connected to the switching-off voltage signal input terminal; and in the shift register unit circuit in a last row, the first electrode of the first TFT is connected to the grounding voltage input terminal.

An array substrate includes the shift register provided in the embodiments of the present disclosure.

A display apparatus includes the shift register provided in the embodiments of the present disclosure.

The embodiments of the present disclosure provide a shift register unit circuit, a shift register, an array substrate and a display apparatus, and relate to the technique of liquid crystal display. The first TFT is incorporated in the shift register unit circuit and is used to pull down the level of the node PL when the frame start signal is at the high level and the forward clock signal changes from the low level to the high level, such that the H-line defect generated in the output signal caused by the coupling effect of a coupling circuit can be avoided. In the shift register unit circuit, the shift register, the array substrate and the display apparatus provided in the embodiments of the present disclosure, it is avoided that a poor output signal is generated when the high level is output in the case that a bi-directional scanning is performed, which is advantageous for increasing productivity and yield rate of products.

BRIEF DESCRIPTION OF THE DRAWINGS

In order to explain the technical solutions in the embodiments of the present disclosure or in the prior art more clearly, accompanying drawings required for describing the embodiments of the present disclosure or the prior art will be introduced. Obviously, the accompanying drawings below only show some embodiments of the present disclosure, and based on the accompanying drawings, other accompanying drawings can be obtained by those skilled in the art without paying inventive labor.

FIG. 1i is a waveform diagram of a node PU in the shift register in the prior art;

DETAILED DESCRIPTION

Descriptions will be made clearly and thoroughly for the technical solutions in the embodiments of the present disclosure below, in conjunction with the accompanying drawings of the embodiments of the present disclosure. Obviously, the described embodiments are only some but not all of the embodiments of the present disclosure. Other embodiments obtained by those skilled in the art based on the described embodiments without paying inventive labor shall belong to the scope sought for protection in the present disclosure.

Embodiments of the present disclosure relate to a technique of liquid crystal display, and provide a shift register unit circuit, a shift register, an array substrate and a display apparatus. A first TFT is incorporated in the shift register unit circuit and is used to pull down the level of a node PU when a frame start signal is at a high level and a forward clock signal changes from a low level to the high level, such that the H-line defect generated in an output signal due to the coupling effect of a coupling circuit can be avoided. In the shift register unit circuit, the shift register, the array substrate and the display apparatus provided in the embodiments of the present disclosure, it is avoided that a poor output signal is generated when a high level is output in the case that a bi-directional scanning is performed, which is advantageous for increasing productivity and yield rate of products.

Figure 1A:
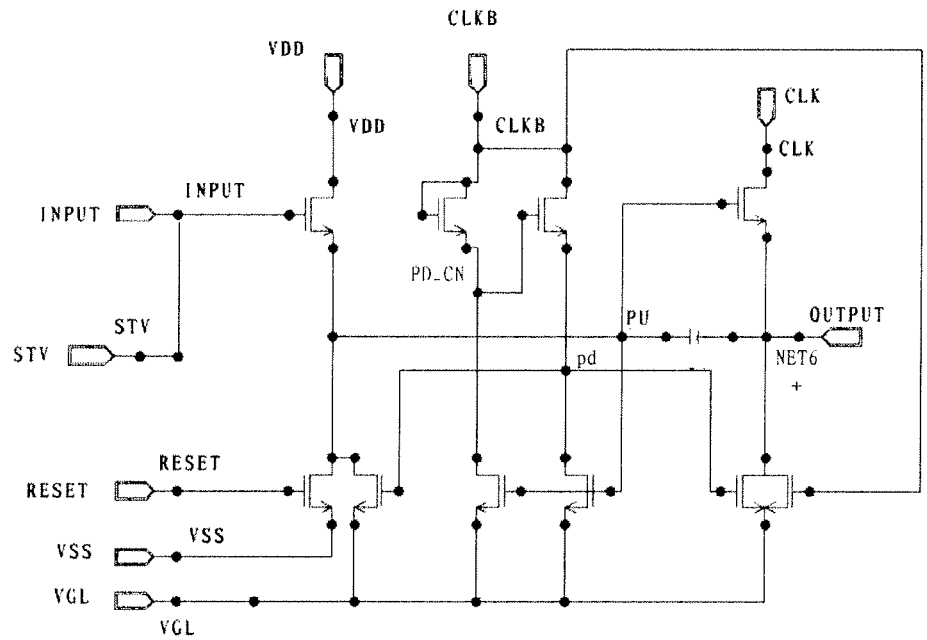
FIG. 1a is a diagram of a shift register unit circuit in a first row in the prior art.
Figure 1B:
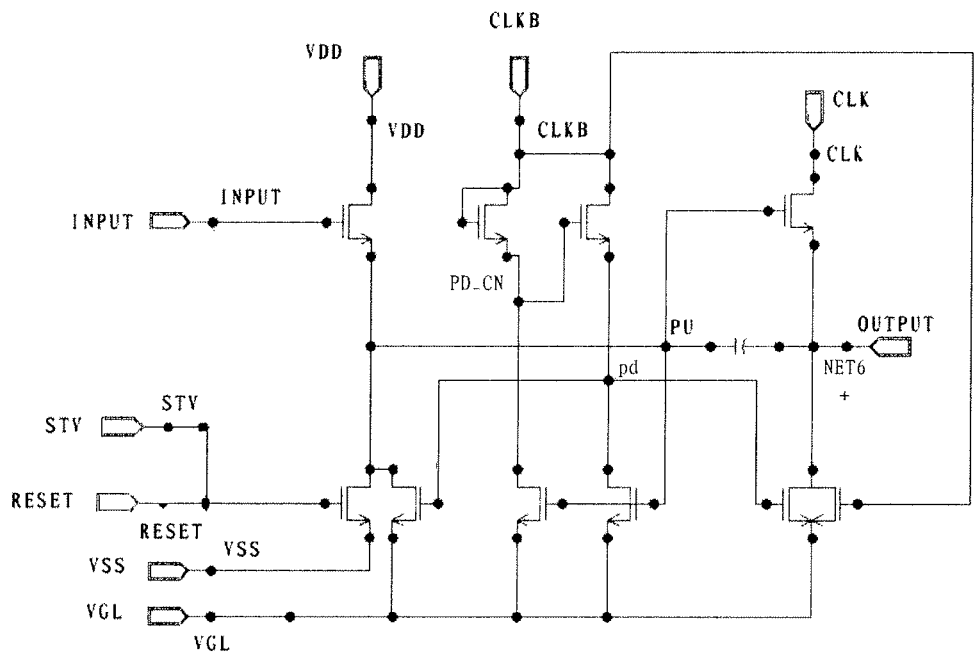
FIG. 1b is a diagram of a shift register unit circuit in a last row in the prior art.
Figure 1C:
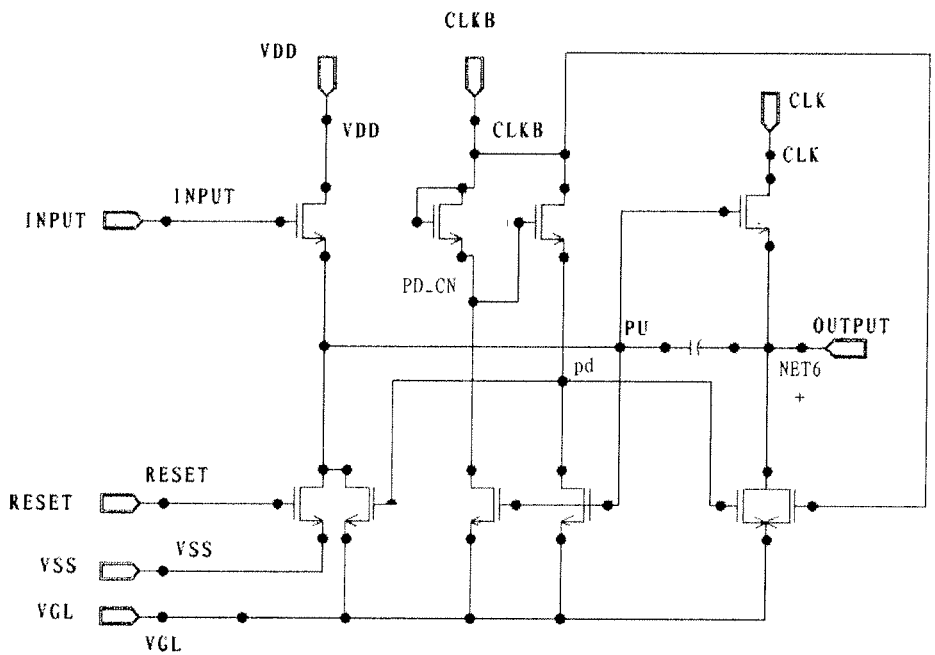
FIG. 1c is a diagram of a shift register unit circuit in a middle row in the prior art.
Figure 1D:
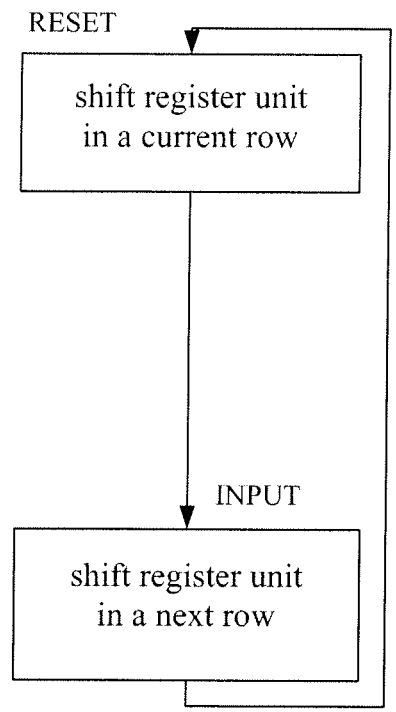
FIG. 1d is a diagram of a forward scanning logic circuit in the prior art.
Figure 1E:
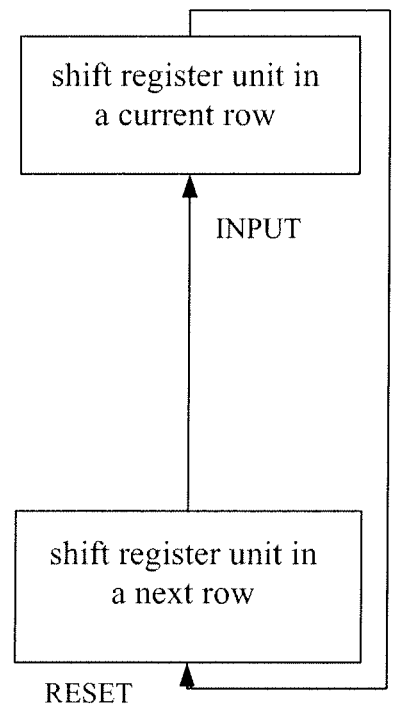
FIG. 1e is a diagram of a reverse scanning logic circuit in the prior art.
Figure 1F:
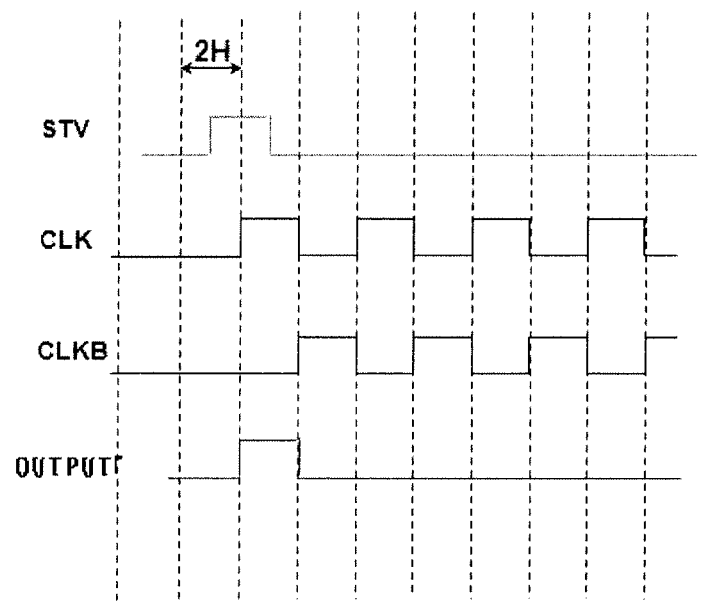
FIG. 1f is a timing sequence diagram of a forward scanning in the prior art.
Figure 1G:
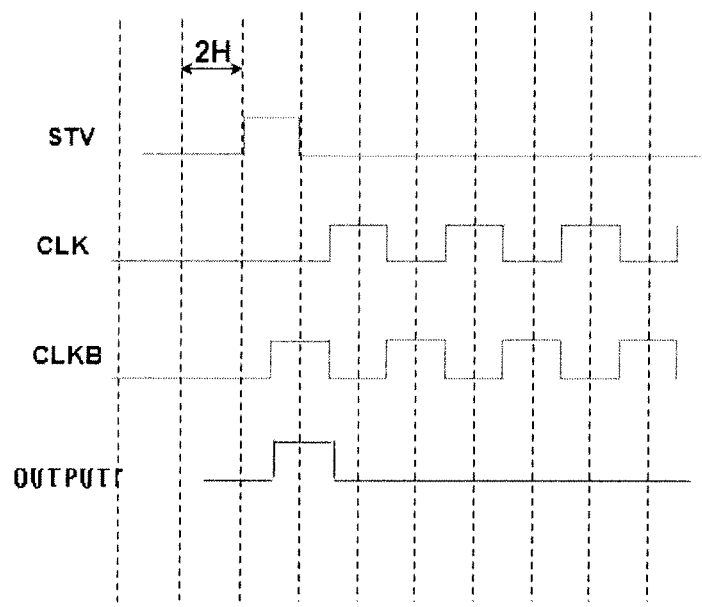
FIG. 1g is a timing sequence diagram of a reverse scanning in the prior art.
Figure 1H:
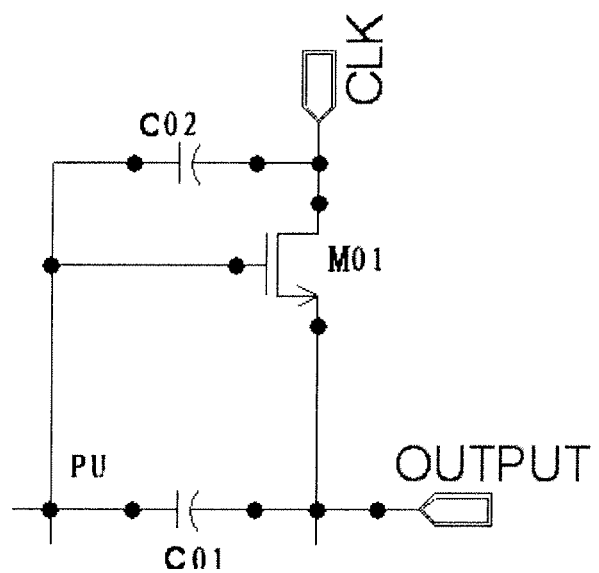
FIG. 1h is a diagram of a coupling circuit in which a parasitic capacitance exists in the prior art.
Figure 11:
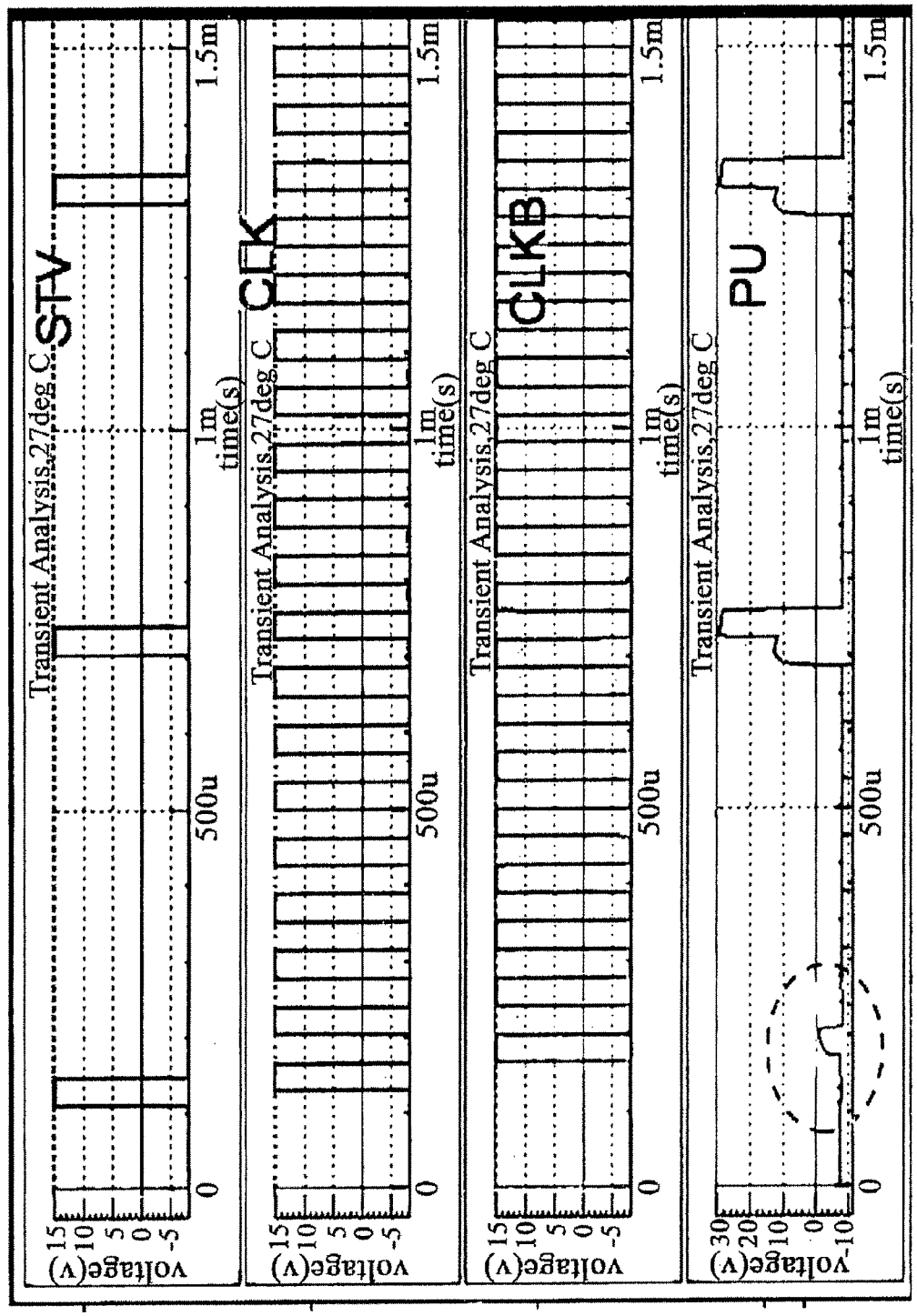
Figure 2A:
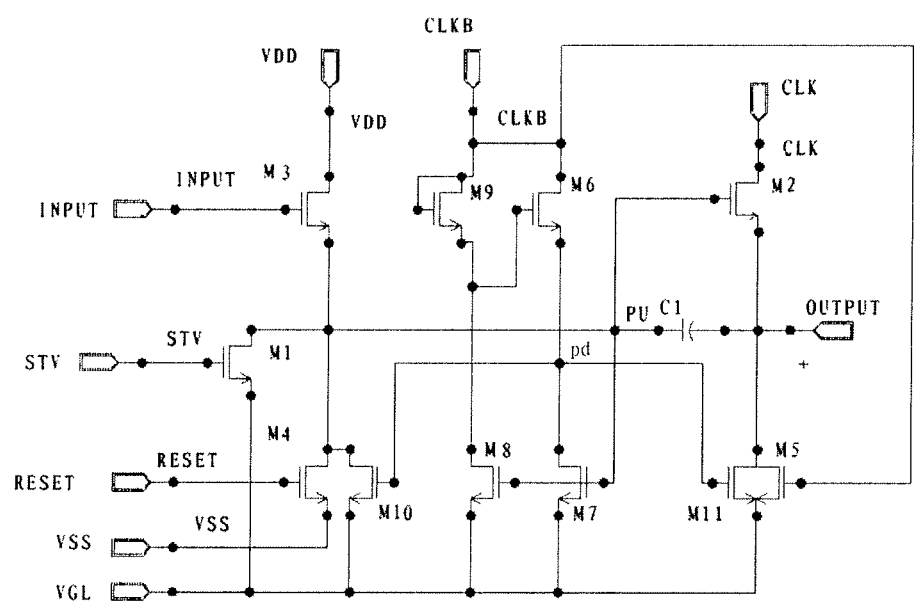
FIG. 2a is a diagram of a shift register unit circuit provided in embodiments of the present disclosure.

As shown in FIG. 2a, the shift register unit circuit provided in the embodiments of the present disclosure includes: a first Thin Film Transistor (TFT) M1 having a gate connected to a frame start signal input terminal, and a first electrode connected to a switching-off voltage signal input terminal, an operating voltage input terminal or a grounding voltage input terminal (in FIG. 2a, taking a case that the first electrode is connected to the switching-off voltage signal input terminal as an example); a second TFT M2 having a gate connected to a second electrode of the first TFT M1, a second electrode connected to a forward clock signal input terminal and a first electrode connected to a signal output terminal; a third TFT M3 having a gate connected to a signal input terminal, a second electrode connected to the operating voltage input terminal and a first electrode connected to the second electrode of the first TFT M1; a fourth TFT M4 having a gate connected to a signal reset terminal, a second electrode connected to the first electrode of the third TFT M3 and a first electrode connected to the grounding voltage input terminal; a fifth TFT M5 having a gate connected to a reverse clock signal input terminal, a second electrode connected to a signal output terminal and a first electrode connected to the switching-off voltage signal input terminal; a capacitor C1 having a first electrode connected to the second electrode of the first TFT M1 and a second electrode connected to the signal output terminal.

Figure 2B:
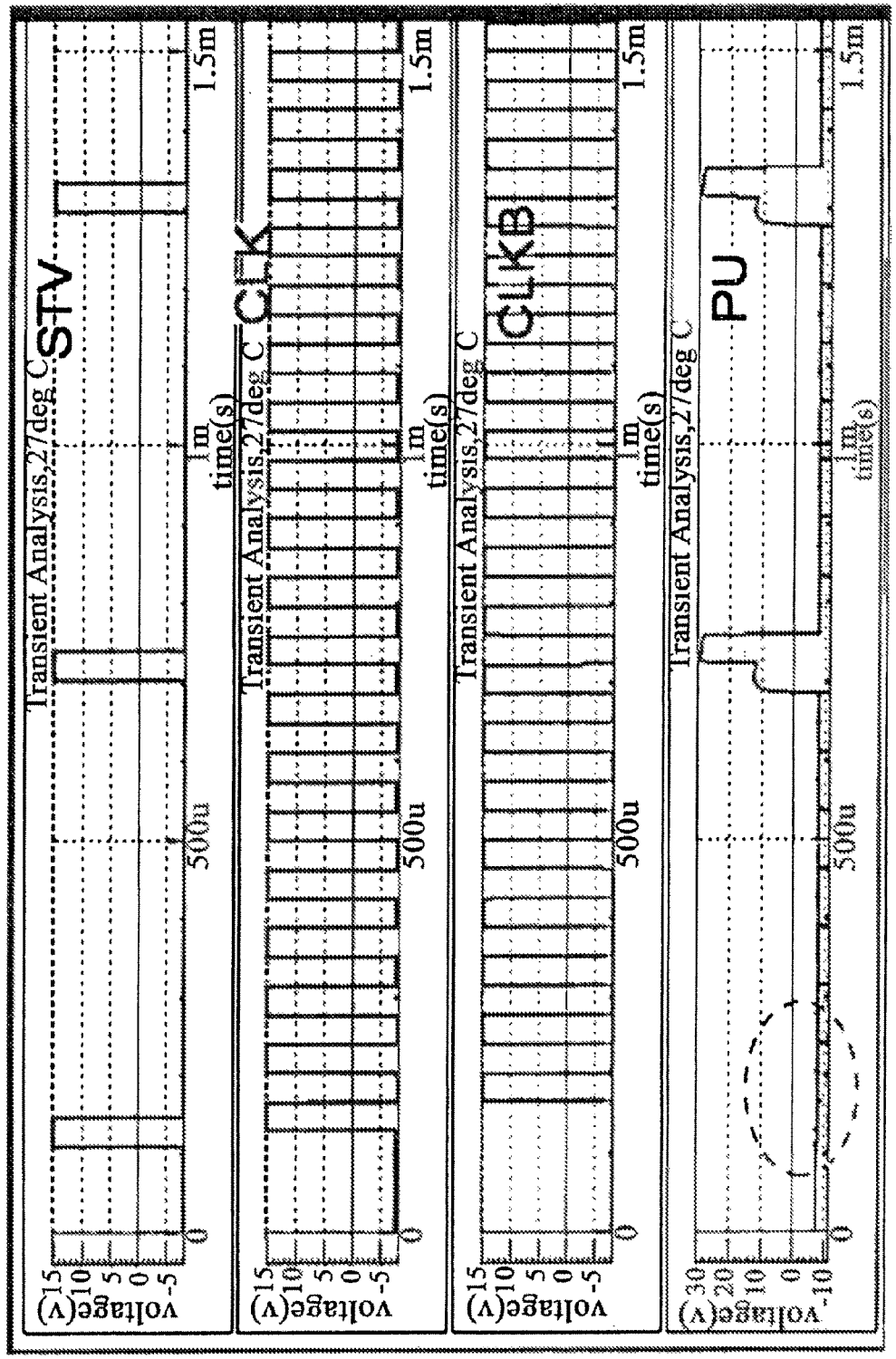
FIG. 2b is a waveform diagram of a node PU in the shift register provided in the embodiments of the present disclosure.

The first TFT M1 performs a function of pulling down the level of a node PU when a frame start signal is at a high level and a forward clock signal changes from a low level to the high level, such that a H-line defect generated in an output signal due to the coupling effect of a coupling circuit will be avoided. The waveform of the node PU in the embodiments of the present disclosure is as shown in FIG. 2b, when the frame start signal is at the high level, the level of the node PU is pulled down by the first TFT M1, such that the swell in the level of the node PU and the H-line defect in the output signal are suppressed.

Preferably, as shown in FIG. 2a, the shift register unit circuit provided in the embodiments of the present disclosure further includes: a sixth TFT M6 having a second electrode connected to the reverse clock signal input terminal; a seventh TFT M7 having a gate connected to the first electrode of the capacitor C1, a second electrode connected to a first electrode of the sixth TFT M6 and a first electrode connected to the switching-off voltage signal input terminal; an eighth TFT M8 having a gate connected to the first electrode of the capacitor C1 and a first electrode connected to the switching-off voltage signal input terminal; a ninth TFT M9 having a gate connected to the reverse clock signal input terminal, a second electrode connected to the reverse clock signal input terminal and a first electrode connected to a second electrode of the eighth TFT M8 and a gate of the sixth TFT M6; a tenth TFT M10 having a gate connected to the second electrode of the seventh TFT M7, a second electrode connected to the second electrode of the first TFT M1 and a first electrode connected to the switching-off voltage signal input terminal; an eleventh TFT M11 having a gate connected to the second electrode of the seventh TFT M7, a second electrode connected to the signal output terminal and a first electrode connected to the switching-off voltage signal input terminal.

A TFT shift register provided in the embodiments of the present disclosure includes at least three shift register unit circuits provided in the embodiments of the present disclosure. In the shift register unit circuit in a first row, the first electrode of the first TFT M1 is connected to the operating voltage input terminal; in the shift register unit circuit in a middle row, the first electrode of the first TFT M1 is connected to the switching-off voltage signal input terminal; and in the shift register unit circuit in a last row, the first electrode of the first TFT M1 is connected to the grounding voltage input terminal.

Figure 2C:
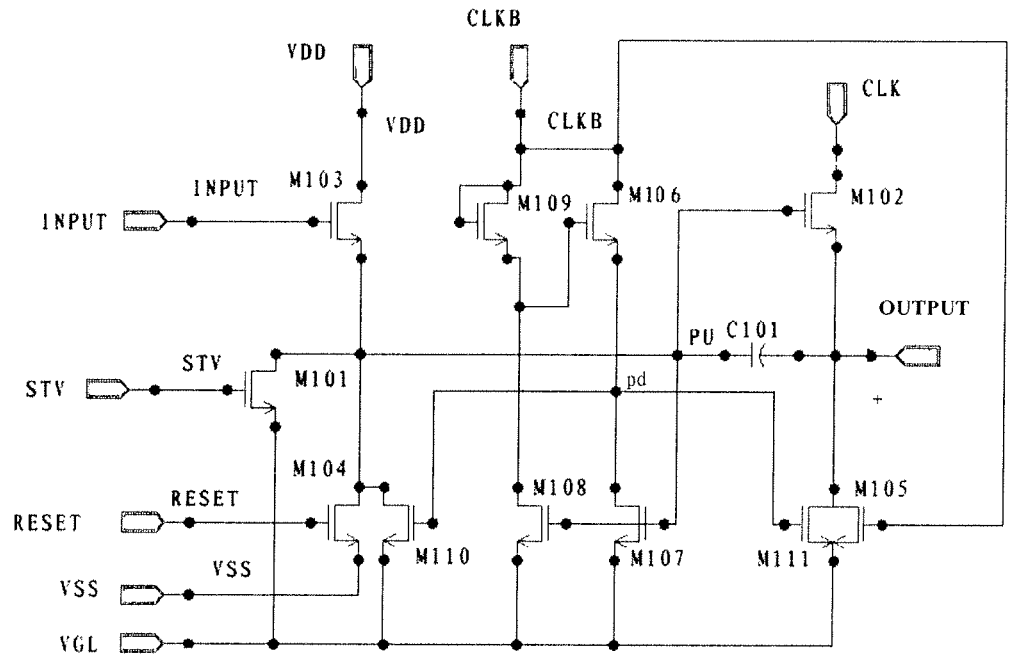
FIG. 2c is a diagram of a shift register unit circuit in a middle row provided in the embodiments of the present disclosure.

Preferably, as shown in FIG. 2c, the shift register unit circuit in a middle row (hereinafter referred to as a middle-row shift register unit circuit) particularly includes: a middle-row first TFT M101 having a gate connected to the frame start signal input terminal, and a first electrode connected to the switching-off voltage signal input terminal, the operating voltage input terminal or the grounding voltage input terminal; a middle-row second TFT M102 having a gate connected to a second electrode of the middle-row first TFT M101, a second electrode connected to the forward clock signal input terminal and a first electrode connected to the signal output terminal; a middle-row third TFT M103 having a gate connected to the signal input terminal, a second electrode connected to the operating voltage input terminal and a first electrode connected to the second electrode of the middle-row first TFT M101; a middle-row fourth TFT M104 having a gate connected to the signal reset terminal, a second electrode connected to the first electrode of the middle-row third TFT M103 and a first electrode connected to the grounding voltage input terminal; a middle-row fifth TFT M105 having a gate connected to the reverse clock signal input terminal, a second electrode connected to the signal output terminal and a first electrode connected to the switching-off voltage signal input terminal; and a middle-row capacitor C101 having a first electrode connected to the second electrode of the middle-row first TFT M101 and a second electrode connected to the signal output terminal.

Figure 2D:
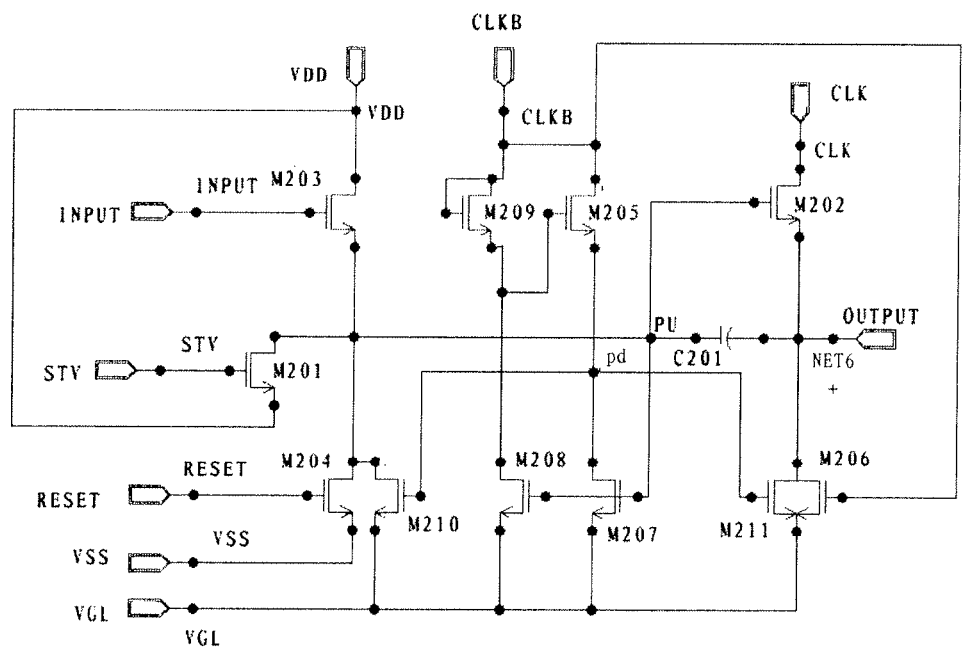
FIG. 2d is a diagram of a shift register unit circuit in a first row provided in the embodiments of the present disclosure.

As shown in FIG. 2d, the shift register unit circuit in a first row (hereinafter referred to as a first-row shift register unit circuit) particularly includes: a first-row first TFT M201 having a gate connected to the frame start signal input terminal, and a first electrode connected to the operating voltage input terminal; a first-row second TFT M202 having a gate connected to a second electrode of the first-row first TFT M201, a second electrode connected to the forward clock signal input terminal and a first electrode connected to the signal output terminal; a first-row third TFT M203 having a gate connected to the signal input terminal, a second electrode connected to the operating voltage input terminal and a first electrode connected to the second electrode of the first-row first TFT M201; a first-row fourth TFT M204 having a gate connected to the signal reset terminal, a second electrode connected to the first electrode of the first-row third TFT M203 and a first electrode connected to the grounding voltage input terminal; a first-row fifth TFT M205 having a gate connected to the reverse clock signal input terminal, a second electrode connected to the signal output terminal and a first electrode connected to the switching-off voltage signal input terminal; and a first-row capacitor C201 having a first electrode connected to the second electrode of the first-row first TFT M201 and a second electrode connected to the signal output terminal.

Figure 2E:
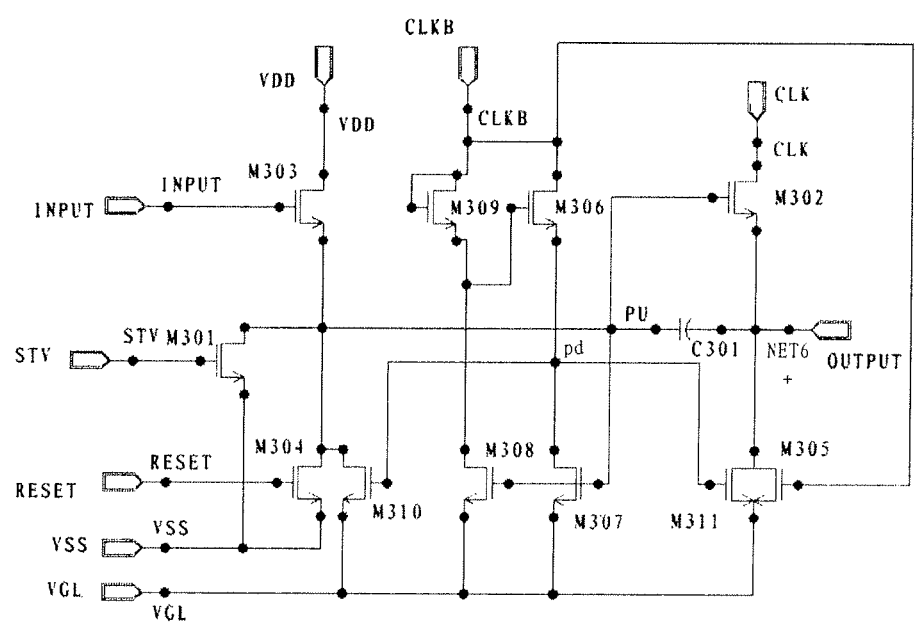
FIG. 2e is a diagram of a preferable shift register unit circuit in a last row provided in the embodiments of the present disclosure.

As shown in FIG. 2e, the shift register unit circuit in a last row (hereinafter referred to as a last-row shift register unit circuit) particularly includes: a last-row first TFT M301 having a gate connected to the frame start signal input terminal, and a first electrode connected to the grounding voltage input terminal; a last-row second TFT M302 having a gate connected to a second electrode of the last-row first TFT M301, a second electrode connected to the forward clock signal input terminal and a first electrode connected to the signal output terminal; a last-row third TFT M303 having a gate connected to the signal input terminal, a second electrode connected to the operating voltage input terminal and a first electrode connected to the second electrode of the last-row first TFT M301; a last-row fourth TFT M304 having a gate connected to the signal reset terminal, a second electrode connected to the first electrode of the last-row third TFT M303 and a first electrode connected to the grounding voltage input terminal; a last-row fifth TFT M305 having a gate connected to the reverse clock signal input terminal, a second electrode connected to the signal output terminal and a first electrode connected to the switching-off voltage signal input terminal; and a last-row capacitor C301 having a first electrode connected to the second electrode of the last-row first TFT M301 and a second electrode connected to the signal output terminal.

In the first-row shift register unit circuit and the last-row shift register unit circuit provided in the embodiments of the present disclosure, the first electrode of the first-row first TFT M201 is connected to the operating voltage input terminal, the first electrode of the last-row first TFT M301 is connected to the grounding voltage input terminal, thus ensuring that the whole TFT shift register can operate normally.

Since there are not any swells at the node PU in the first-row shift register unit circuit and the last-row shift register unit circuit, the following arrangements may be adopted: a first-row shift register unit circuit without the first-row first TFT M201 being incorporated and a last-row shift register unit circuit without the last-row first TFT M301 being incorporated; a first-row shift register unit circuit with the first-row first TFT M201 being incorporated and a last-row shift register unit circuit without the last-row first TFT M301 being incorporated; a first-row shift register unit circuit without the first-row first TFT M201 being incorporated and a last-row shift register unit circuit with the last-row first TFT M301 being incorporated; or a first-row shift register unit circuit with the first-row first TFT M201 being incorporated and a last-row shift register unit circuit with the last-row first TFT M301 being incorporated.

Of course, those skilled in the art can set the first-row shift register unit circuit and the last-row shift register unit circuit by adopting other practical manners.

As shown in FIG. 2c, the preferred middle-row shift register unit circuit provided in the embodiments of the disclosure includes: the middle-row first TFT M101 having the gate connected to the frame start signal input terminal, and the first electrode connected to the switching-off voltage signal input terminal; the middle-row second TFT M102 having the gate connected to the second electrode of the middle-row first TFT M101, the second electrode connected to the forward clock signal input terminal and the first electrode connected to the signal output terminal; the middle-row third TFT M103 having the gate connected to the signal input terminal, the second electrode connected to the operating voltage input terminal and the first electrode connected to the second electrode of the middle-row first TFT M101; the middle-row fourth TFT M104 having the gate connected to the signal reset terminal, the second electrode connected to the first electrode of the middle-row third TFT M103 and the first electrode connected to the grounding voltage input terminal; the middle-row fifth TFT M105 having the gate connected to the reverse clock signal input terminal, the second electrode connected to the signal output terminal and the first electrode connected to the switching-off voltage signal input terminal; and the middle-row capacitor C101 having the first electrode connected to the second electrode of the middle-row first TFT M101 and the second electrode connected to the signal output terminal.

The middle-row third TFT M103, the middle-row fourth TFT M104, the middle-row fifth TFT M105 and the middle-row second TFT M102, as well as the middle-row capacitor C101 achieve a basis shift register function together, particularly in the following manner: when the input signal is at the high level, the middle-row third TFT M103 is turned on to charge the node PU; when the forward clock signal is at the high level, the middle-row second TFT M102 is turned on, and the signal output terminal outputs a pulse of the forward clock signal, meanwhile a bootstrapping effect of the middle-row capacitor C101 further pulls up the level of the node PU; then the middle-row fourth TFT M104 and the middle-row fifth TFT M105 are turned on by the reset signal to discharge the node PU and the signal output terminal, thus achieving the basis shift register function. Of course, those skilled in the art can adopt other practical manner to achieve the basis register function.

Preferably, the middle-row shift register unit circuit further includes: a middle-row sixth TFT M106 having a second electrode connected to the reverse clock signal input terminal; a middle-row seventh TFT M107 having a gate connected to the first electrode of the middle-row capacitor C101, a second electrode connected to a first electrode of the middle-row sixth TFT M106 and a first electrode connected to the switching-off voltage signal input terminal; a middle-row eighth TFT M108 having a gate connected to the first electrode of the middle-row capacitor C101 and a first electrode connected to the switching-off voltage signal input terminal; a middle-row ninth TFT M109 having a gate connected to the reverse clock signal input terminal, a second electrode connected to the reverse clock signal input terminal and a first electrode connected to a second electrode of the middle-row eighth TFT M108 and a gate of the middle-row sixth TFT M106; a middle-row tenth TFT M110 having a gate connected to the second electrode of the middle-row seventh TFT M107, a second electrode connected to the second electrode of the middle-row first TFT M101 and a first electrode connected to the switching-off voltage signal input terminal; a middle-row eleventh TFT M111 having a gate connected to the second electrode of the middle-row seventh TFT M107, a second electrode connected to the signal output terminal and a first electrode connected to the switching-off voltage signal input terminal.

As shown in FIG. 2d, the first-row shift register unit circuit provided in the embodiments of the present disclosure includes: the first-row first TFT M201 having the gate connected to the frame start signal input terminal, and the first electrode connected to the operating voltage input terminal; the first-row second TFT M202 having the gate connected to the second electrode of the first-row first TFT M201, the second electrode connected to the forward clock signal input terminal and the first electrode connected to the signal output terminal; the first-row third TFT M203 having the gate connected to the signal input terminal, the second electrode connected to the operating voltage input terminal and the first electrode connected to the second electrode of the first-row first TFT M201; the first-row fourth TFT M204 having the gate connected to the signal reset terminal, the second electrode connected to the first electrode of the first-row third TFT M203 and the first electrode connected to the grounding voltage input terminal; the first-row fifth TFT M205 having the gate connected to the reverse clock signal input terminal, the second electrode connected to the signal output terminal and the first electrode connected to the switching-off voltage signal input terminal; and the first-row capacitor C201 having the first electrode connected to the second electrode of the first-row first TFT M201 and the second electrode connected to the signal output terminal.

The first-row third TFT M203, the first-row fourth TFT M204, the first-row fifth TFT M205 and the first-row second TFT M202, as well as the first-row capacitor C201 achieve a basis shift register function together, particularly in the following manner: when the input signal is at the high level, the first-row third TFT M203 is turned on to charge the node PU; when the forward clock signal is at the high level, the first-row second TFT M202 is turned on, and the signal output terminal outputs a pulse of the forward clock signal, meanwhile a bootstrapping effect of the first-row capacitor C201 further pulls up the level of the node PU; then the first-row fourth TFT M204 and the first-row fifth TFT M205 are turned on by the reset signal to discharge the node PU and the signal output terminal, thus achieving the basis shift register function. Of course, those skilled in the art can adopt other practical manners to achieve the basis register function.

Preferably, the first-row shift register unit circuit further includes: a first-row sixth TFT M206 having a second electrode connected to the reverse clock signal input terminal; a first-row seventh TFT M207 having a gate connected to the first electrode of the first-row capacitor C201, a second electrode connected to a first electrode of the first-row sixth TFT M206 and a first electrode connected to the switching-off voltage signal input terminal; a first-row eighth TFT M208 having a gate connected to the first electrode of the first-row capacitor C201 and a first electrode connected to the switching-off voltage signal input terminal; a first-row ninth TFT M209 having a gate connected to the reverse clock signal input terminal, a second electrode connected to the reverse clock signal input terminal and a first electrode connected to a second electrode of the first-row eighth TFT M208 and a gate of the first-row sixth TFT M206; a first-row tenth TFT M210 having a gate connected to the second electrode of the first-row seventh TFT M207, a second electrode connected to the second electrode of the first-row first TFT M201 and a first electrode connected to the switching-off voltage signal input terminal; a first-row eleventh TFT M211 having a gate connected to the second electrode of the first-row seventh TFT M207, a second electrode connected to the signal output terminal and a first electrode connected to the switching-off voltage signal input terminal.

As shown in FIG. 2e, the last-row shift register unit circuit provided in the embodiments of the present disclosure includes: the last-row first TFT M301 having the gate connected to the frame start signal input terminal, and the first electrode connected to the grounding voltage input terminal; the last-row second TFT M302 having the gate connected to the second electrode of the last-row first TFT M301, the second electrode connected to the forward clock signal input terminal and the first electrode connected to the signal output terminal; the last-row third TFT M303 having the gate connected to the signal input terminal, the second electrode connected to the operating voltage input terminal and the first electrode connected to the second electrode of the last-row first TFT M301; the last-row fourth TFT M304 having the gate connected to the signal reset terminal, the second electrode connected to the first electrode of the last-row third TFT M303 and the first electrode connected to the grounding voltage input terminal; the last-row fifth TFT M305 having the gate connected to the reverse clock signal input terminal, the second electrode connected to the signal output terminal and the first electrode connected to the switching-off voltage signal input terminal; and the last-row capacitor C301 having the first electrode connected to the second electrode of the last-row first TFT M301 and the second electrode connected to the signal output terminal.

The last-row third TFT M303, the last-row fourth TFT M304, the last-row fifth TFT M305 and the last-row second TFT M302, as well as the last-row capacitor C301 achieve a basis shift register function together, particularly in the following manner: when the input signal is at the high level, the last-row third TFT M303 is turned on to charge the node PU; when the forward clock signal is at the high level, the last-row second TFT M302 is turned on, and the signal output terminal outputs a pulse of the forward clock signal, meanwhile a bootstrapping effect of the last-row capacitor C301 further pulls up the level of the node PU; then the last-row fourth TFT M304 and the last-row fifth TFT M305 are turned on by the reset signal to discharge the node PU and the signal output terminal, thus achieving the basis shift register function. Of course, those skilled in the art can adopt other practical manners to achieve the basis register function.

Preferably, the last-row shift register unit circuit further includes: a last-row sixth TFT M306 having a second electrode connected to the reverse clock signal input terminal; a last-row seventh TFT M307 having a gate connected to the first electrode of the last-row capacitor C301, a second electrode connected to a first electrode of the last-row sixth TFT M306 and a first electrode connected to the switching-off voltage signal input terminal; a last-row eighth TFT M308 having a gate connected to the first electrode of the last-row capacitor C301 and a first electrode connected to the switching-off voltage signal input terminal; a last-row ninth TFT M309 having a gate connected to the reverse clock signal input terminal, a second electrode connected to the reverse clock signal input terminal and a first electrode connected to a second electrode of the last-row eighth TFT M308 and a gate of the last-row sixth TFT M306; a last-row tenth TFT M310 having a gate connected to the second electrode of the last-row seventh TFT M307, a second electrode connected to the second electrode of the last-row first TFT M301 and a first electrode connected to the switching-off voltage signal input terminal; and a last-row eleventh TFT M311 having a gate connected to the second electrode of the last-row seventh TFT M307, a second electrode connected to the signal output terminal and a first electrode connected to the switching-off voltage signal input terminal.

When the TFT shift register provided in the embodiments of the present disclosure performs a forward scanning, the operating voltage input terminal is connected to a positive electrode of a power supply, the grounding voltage input terminal is connected to a negative electrode of the power supply; when the TFT shift register provided in the embodiments of the present disclosure performs a reverse scanning, the operating voltage input terminal is connected to a negative electrode of a power supply, the grounding voltage input terminal is connected to a positive electrode of the power supply. In other words, the shift register provided in the embodiments of the present disclosure can perform a bi-directional driving by exchanging the polarities of the power supply connected to the operating voltage input terminal and the grounding voltage input terminal respectively.

The array substrate provided in the embodiment of the present disclosure includes the TFT shift register provided in the embodiments of the present disclosure.

The display apparatus provided in the embodiment of the present disclosure includes the TFT shift register provided in the embodiments of the present disclosure.

The embodiments of the present disclosure relate to the technique of liquid crystal display, and provide a shift register unit circuit, a shift register, an array substrate and a display apparatus. The first TFT is incorporated in the shift register unit circuit and is used to pull down the level of the node PU when the frame start signal is at the high level and the forward clock signal changes from the low level to the high level, such that the H-line defect generated in the output signal caused by the coupling effect of a coupling circuit can be avoided. In the shift register unit circuit, the shift register, the array substrate and the display apparatus provided in the embodiments of the present disclosure, it is avoided that a poor output signal is generated when the high level is output in the case that a bi-directional scanning is performed, which is advantageous for increasing productivity and yield rate of products.

The above descriptions are only for illustrating the embodiments of the present disclosure, and in no way limit the scope of the present disclosure. It will be obvious that those skilled in the art may make modifications, variations and equivalences to the above embodiments without departing the spirit and scope of the present disclosure as defined by the following claims. Such variations and modifications are intended to be included within the spirit and scope of the present disclosure.

What is claimed is:

1. A shift register unit circuit including:
    a first Thin Film Transistor TFT having a gate connected to a frame start signal input terminal, a first electrode connected to a switching-off voltage signal input terminal, an operating voltage input terminal or a grounding voltage input terminal, and a second electrode connected to a pull-up node directly;
    a second TFT having a gate connected to the pull-up node directly, a second electrode connected to a forward clock signal input terminal, and a first electrode connected to a signal output terminal directly;
    a third TFT having a gate connected to a signal input terminal directly, a second electrode connected to an operating voltage input terminal directly, and a first electrode connected to the pull-up node directly;
    a fourth TFT having a gate connected to a signal reset terminal directly, a second electrode connected to the pull-up node directly, and a first electrode connected to the grounding voltage input terminal;
    a fifth TFT having a gate connected to a reverse clock signal input terminal, a second electrode connected to a signal output terminal, and a first electrode connected to the switching-off voltage signal input terminal; and
    a capacitor having a first electrode connected to the pull-up node directly and a second electrode connected to the signal output terminal directly.

2. The shift register unit circuit of claim 1, further including:
    a sixth TFT having a second electrode connected to the reverse clock signal input terminal;
    a seventh TFT having a gate connected to the pull-up node, a second electrode connected to a first electrode of the sixth TFT M6, and a first electrode connected to the switching-off voltage signal input terminal;

an eighth TFT having a gate connected to the pull-up node and a first electrode connected to the switching-off voltage signal input terminal;

a ninth TFT having a gate connected to the reverse clock signal input terminal, a second electrode connected to the reverse clock signal input terminal, and a first electrode connected to a second electrode of the eighth TFT and a gate of the sixth TFT;

a tenth TFT having a gate connected to the second electrode of the seventh TFT, a second electrode connected to the pull-up node and a first electrode connected to the switching-off voltage signal input terminal; and an eleventh TFT having a gate connected to the second electrode of the seventh TFT, a second electrode connected to the signal output terminal, and a first electrode connected to the switching-off voltage signal input terminal.

3. The shift register unit circuit of claim 1, wherein the first electrode of TFT is source and the second electrode of TFT is drain, and the first electrode of the capacitor is a positive electrode and the second electrode of the capacitor is a negative electrode.

4. A shift register including at least three shift register unit circuits of claim 1, wherein in the shift register unit circuit in a first row, the first electrode of the first TFT is connected to the operating voltage input terminal; in the shift register unit circuit in a middle row, the first electrode of the first TFT is connected to the switching-off voltage signal input terminal; and in the shift register unit circuit in a last row, the first electrode of the first TFT is connected to the grounding voltage input terminal.

5. The shift register of claim 4, wherein when the TFT shift register performs a forward scanning, the operating voltage input terminal is connected to a positive electrode of a power supply, the grounding voltage input terminal is connected to a negative electrode of the power supply; when the TFT shift register performs a reverse scanning, the operating voltage input terminal is connected to the negative electrode of the power supply, the grounding voltage input terminal is connected to the positive electrode of the power supply.

6. An array substrate including the shift register of claim 4.

* * * * *